(12) United States Patent
Bahadori et al.

(10) Patent No.: US 12,092,778 B2
(45) Date of Patent: Sep. 17, 2024

(54) MINIATURIZED FAST NEUTRON SPECTROMETER

(71) Applicant: Kansas State University Research Foundation, Manhttan, KS (US)

(72) Inventors: Amir Bahadori, Manhattan, KS (US); Zayd Leseman, Dhahran (SA)

(73) Assignee: Kansas State University Research Foundation, Manhattan, KS (US)

( * ) Notice: Subject to any disclaimer, the term of this patent is extended or adjusted under 35 U.S.C. 154(b) by 660 days.

(21) Appl. No.: 17/270,101

(22) PCT Filed: Aug. 21, 2019

(86) PCT No.: PCT/US2019/047441
§ 371 (c)(1),
(2) Date: Feb. 22, 2021

(87) PCT Pub. No.: WO2020/041429
PCT Pub. Date: Feb. 27, 2020

(65) Prior Publication Data
US 2021/0239865 A1    Aug. 5, 2021

Related U.S. Application Data

(60) Provisional application No. 62/721,239, filed on Aug. 22, 2018.

(51) Int. Cl.
*G01T 3/08* (2006.01)
*H01L 27/144* (2006.01)
(Continued)

(52) U.S. Cl.
CPC .......... *G01T 3/085* (2013.01); *H01L 27/1446* (2013.01); *H01L 31/028* (2013.01); *H01L 31/035281* (2013.01); *H01L 31/117* (2013.01)

(58) Field of Classification Search
CPC ... G01T 3/085; H01L 27/1446; H01L 31/028; H01L 31/035281; H01L 31/117; H01J 47/12
See application file for complete search history.

(56) References Cited

U.S. PATENT DOCUMENTS 4,588,898 A    5/1986  Piesch et al.
5,321,269 A *  6/1994  Kitaguchi ................ G01T 3/08
                                                    250/252.1

(Continued)

FOREIGN PATENT DOCUMENTS

GB        2480676        11/2011

OTHER PUBLICATIONS

International Search Report and Written Opinion in corresponding PCT/US2019/047441, dated Feb. 18, 2020.

*Primary Examiner* — David P Porta
*Assistant Examiner* — Mamadou Faye
(74) *Attorney, Agent, or Firm* — Hovey Williams LLP

(57) ABSTRACT

An isotropic neutron detector includes a spherical secondary particle radiator component and a plurality of stacked semiconductor detectors. A first semiconductor detector is coupled to at least a portion of the spherical secondary particle radiator component, forming a portion of a first concentric shell thereover. A second semiconductor detector coupled to at least a portion of the first semiconductor detector, forming a portion of a second concentric shell thereover.

5 Claims, 8 Drawing Sheets

(51) Int. Cl.
H01L 31/028 (2006.01)
H01L 31/0352 (2006.01)
H01L 31/117 (2006.01)

(56) References Cited

U.S. PATENT DOCUMENTS

| | | | | |
|---|---|---|---|---|
| 5,726,453 | A * | 3/1998 | Lott | G01T 3/08 |
| | | | | 250/390.11 |
| 9,081,100 | B1 * | 7/2015 | Bellinger | G01T 3/085 |
| 2010/0301222 | A1 * | 12/2010 | Tanner | G01T 3/00 |
| | | | | 250/391 |
| 2011/0180718 | A1 | 7/2011 | Luszik-Bhadra et al. | |
| 2015/0053863 | A1 * | 2/2015 | Cao | H01L 31/03044 |
| | | | | 250/370.11 |
| 2016/0314941 | A1 * | 10/2016 | Giomataris | G01T 1/185 |
| 2017/0077089 | A1 | 3/2017 | Ogura et al. | |

\* cited by examiner

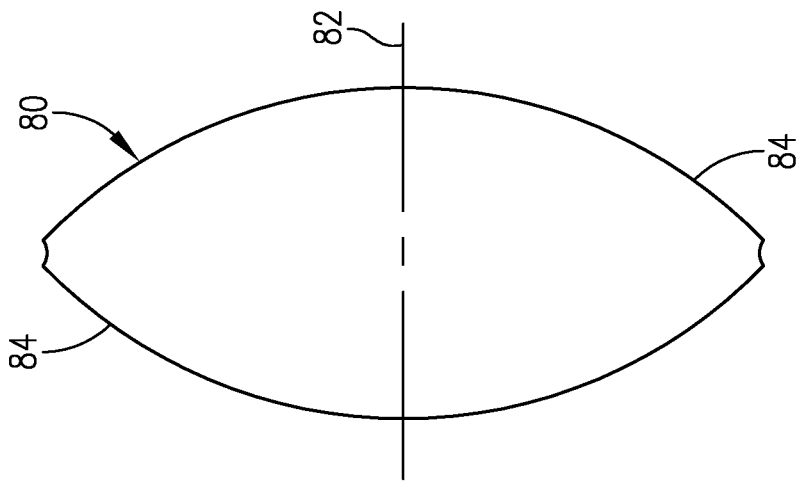
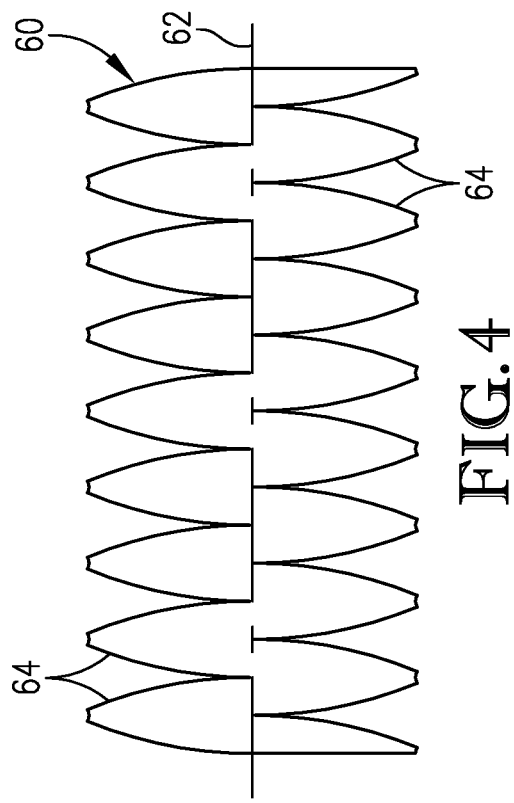
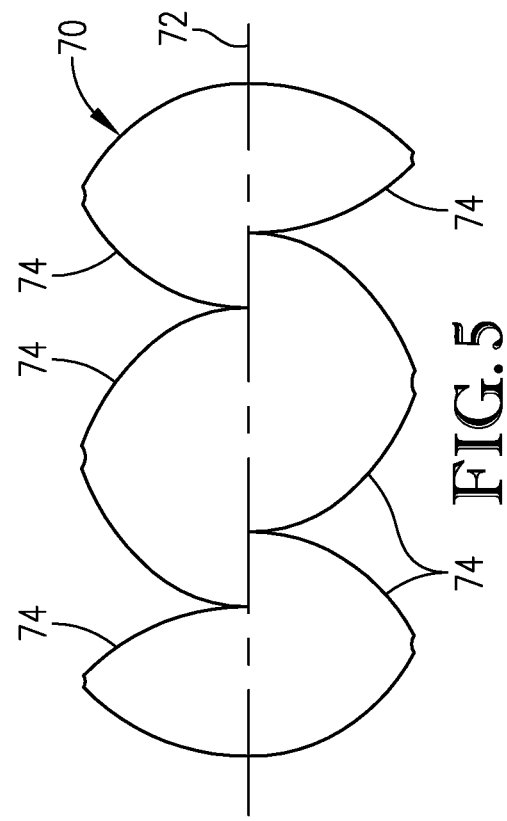

MINIATURIZED FAST NEUTRON SPECTROMETER

CROSS-REFERENCE TO RELATED APPLICATIONS

The present application is the U.S. National Stage of International Patent Application No. PCT/US2019/047441, filed Aug. 21, 2019, which claims the priority benefit of U.S. Provisional Patent Application Ser. No. 62/721,239, filed Aug. 22, 2018, entitled MINIATURIZED FAST NEUTRON SPECTROMETER, each of which is incorporated by reference in its entirety herein.

BACKGROUND

The present disclosure relates to neutron detectors, and more particularly to an isotropic fast neutron detector using a spherical-shaped, multi-layer semiconductor structure.

Ionizing radiation (IR) is a known carcinogen. To ensure that individuals are not unacceptably exposed to IR, areas that are suspected or known to have elevated IR levels are monitored with radiation detectors. While radiation monitoring is traditionally focused on ensuring radiation exposures do not exceed pre-determined limits, understanding the energy spectrum of IR through spectroscopic measurements allows the radiation specialist to more completely characterize the risk of radiogenic cancer from a particular radiation source.

Neutrons are a form of IR and present a significant challenge for radiation monitoring. To better characterize cancer risk from neutron exposure, a kinetic energy-dependent weighting factor is typically utilized. Therefore, understanding the neutron kinetic energy spectrum is vital for providing accurate estimates of cancer risk from neutron exposure.

Heavy charged particle therapy centers, space vehicles, nuclear reactors, and particle accelerators share common radiation protection characteristics, especially with regard to secondary neutrons. For example, during heavy charged particle radiotherapy, the patient is a source of secondary neutrons from interactions of the primary beam with tissue. In space vehicles, heavy charged particles including galactic cosmic rays interact with structure, supplies, and astronauts to generate a secondary neutron radiation field. Nuclear reactors and particle accelerators are large neutron sources in which neutron radiation can be generated, for example, from radioactive decay or particle interactions.

Commonly, bonner ball neutron detectors (BBNDs) and capture-gated neutron scintillator detectors (CGNSDs) are employed in neutron spectroscopy. Both methods rely on neutron collisions with atomic nuclei to reduce neutron kinetic energy and subsequent capture of thermal neutrons. BBNDs consist of a set of polyethylene spheres with varying sizes, each with a thermal neutron detector at the center. The detector response for each sphere is characterized as a function of incident neutron kinetic energy using radiation transport codes. Inverse solution techniques are used to solve for the incident spectrum. Other design variations have been developed, including a device that has a large number of thermal neutron detectors embedded in one piece of plastic. Since they rely on slowing fast neutrons, the maximum resolvable neutron kinetic energy is dependent on the size of the largest BBND, which has a diameter on the order of 30 cm. As such, BBNDs are impractical for measuring neutron fields at multiple locations in a radiation therapy facility or on spacecraft due to unacceptable mass and volume requirements.

CGNSDs provide information on incident neutron kinetic energy directly. When a neutron interacts in the plastic scintillator, recoil nuclei deposit energy, which is converted to light. When the neutron is ultimately captured, a large signal is obtained. The incident neutron energy is found as the sum of the signals from the scintillator for some time prior to the capture pulse. CGNSDs have been used for space neutron detection, but they have the drawback of complex signal processing requirements and are challenging to read out. In intense neutron fields, the signals from multiple neutrons may overlap, leading to measurement errors. Like the BBNDs, the maximum kinetic energy that can be characterized is highly dependent on size of the detector.

BRIEF DESCRIPTION

This summary is provided to introduce a selection of concepts in a simplified form that are further described in the detailed description below. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

In one aspect, an isotropic neutron detector is provided. The isotropic neutron detector includes a spherical secondary particle radiator component. The isotropic neutron detector also includes a first semiconductor detector coupled to at least a portion of the spherical secondary particle radiator component, forming a portion of a first concentric shell thereover. In addition, the isotropic neutron detector includes a second semiconductor detector coupled to at least a portion of the first semiconductor detector, forming a portion of a second concentric shell thereover.

In another aspect, a method of determining a neutron kinetic energy spectrum is provided. The method includes generating secondary particles from interactions of a field of incident neutrons and passing the secondary particles into one or more semiconductor detectors. Direct interactions of the neutrons with the semiconductor detector material may also contribute to the signal. In addition, the method includes detecting electrical output signals from the one or more semiconductor detectors. Moreover, the method includes generating an incident neutron energy spectrum based on the detected electrical output signals.

In yet another aspect, a neutron detector is provided. The neutron detector includes a support base having a central opening defined therethrough. In addition, the neutron detector includes a secondary particle radiator component coupled to the support base and positioned at least partially within the central opening. In addition, the neutron detector includes a first semiconductor detector secured at a surface of the secondary particle radiator component and a second semiconductor detector secured against the first semiconductor detector opposite the secondary particle radiator component.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 4 is a schematic of an exemplary single, continuous spherical projection blank that may be used to define a perimeter of a semiconductor detector of the neutron detector of FIG. 2;

FIG. 5 is a schematic of an alternative single, continuous spherical projection blank that may be used to define the perimeter of the semiconductor detector of the neutron detector of FIG. 2;

FIG. 6 is a schematic of an exemplary segment that may be used to define a portion of a segmented semiconductor detector for use with the neutron detector of FIG. 2;

Figure 1:
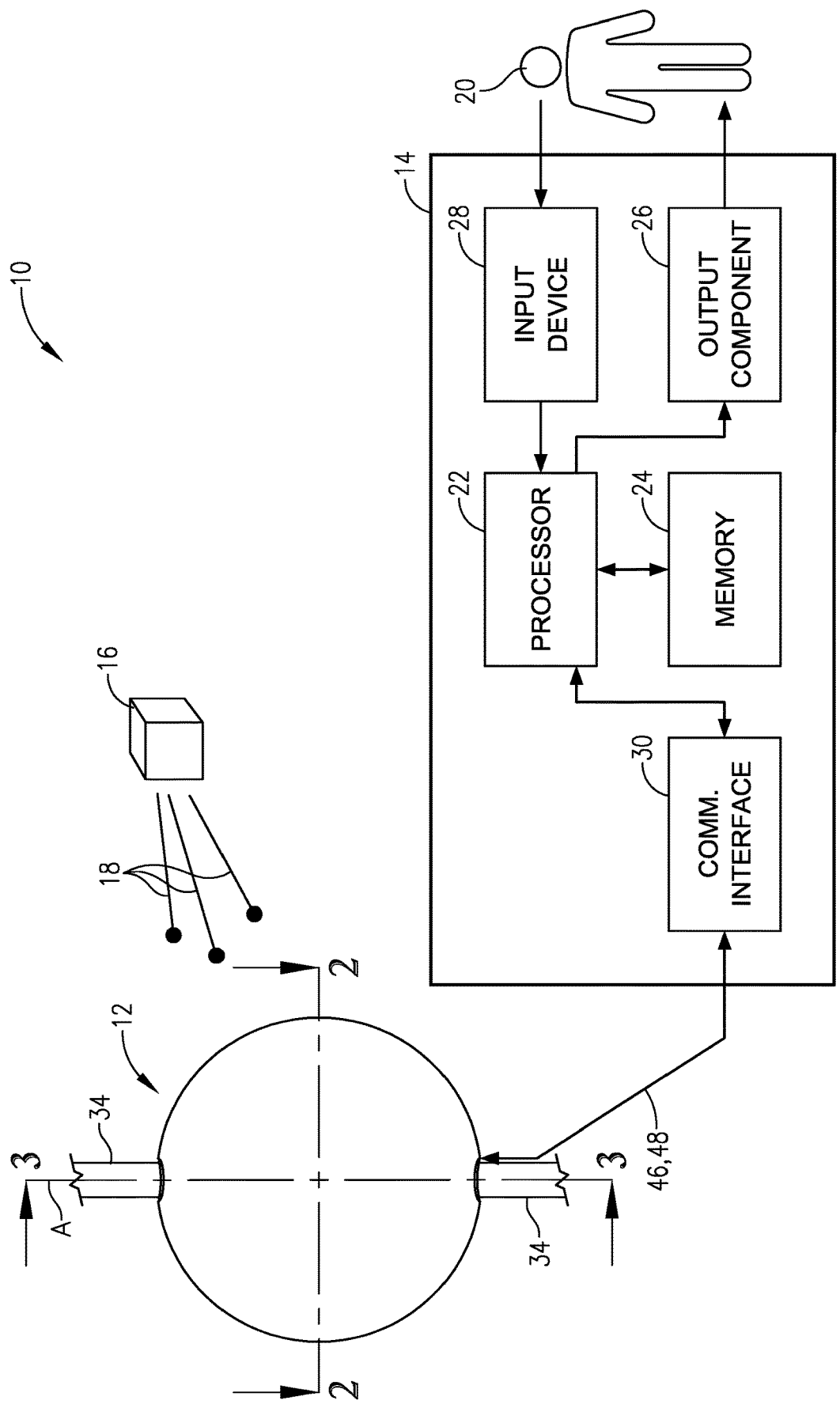
FIG. 1 is a schematic of a neutron detection system for determining a neutron kinetic energy spectrum.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein. While the drawings do not necessarily provide exact dimensions or tolerances for the illustrated components or structures, the drawings are to scale with respect to the relationships between the components of the structures illustrated in the drawings.

DETAILED DESCRIPTION OF THE DISCLOSURE

The following detailed description of embodiments of the disclosure references the accompanying figures. The embodiments are intended to describe aspects of the disclosure in sufficient detail to enable those with ordinary skill in the art to practice the disclosure. The embodiments of the disclosure are illustrated by way of example and not by way of limitation. Other embodiments may be utilized, and changes may be made without departing from the scope of the claims. The following description is, therefore, not limiting. The scope of the present disclosure is defined only by the appended claims, along with the full scope of equivalents to which such claims are entitled.

In this description, references to "one embodiment," "an embodiment," or "embodiments" mean that the feature or features referred to are included in at least one embodiment of the disclosure. Separate references to "one embodiment," "an embodiment," or "embodiments" in this description do not necessarily refer to the same embodiment and are not mutually exclusive unless so stated. Specifically, a feature, component, action, step, etc. described in one embodiment may also be included in other embodiments but is not necessarily included. Thus, particular implementations of the present disclosure can include a variety of combinations and/or integrations of the embodiments described herein.

In the following specification and the claims, reference will be made to several terms, which shall be defined to have the following meanings. The singular forms "a," "an," and "the" include plural references unless the context clearly dictates otherwise. "Optional" or "optionally" means that the subsequently described feature, event, or circumstance may or may not be required or occur and that the description includes instances with or without such element.

Approximating language, as used herein throughout the specification and the claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, directional references, such as, "top," "bottom," "front," "back," "side," and similar terms are used herein solely for convenience and should be understood only in relation to each other. For example, a component might in practice be oriented such that faces referred to herein as "top" and "bottom" are in practice sideways, angled, inverted, etc. relative to the chosen frame of reference.

Broadly, the present disclosure describes an isotropic fast neutron spectrometer where an incident neutron interacts in a secondary particle radiator component that releases a secondary particle in response to a neutron collision. Secondary particles are products of interaction between neutrons and detector materials, including, for example, and without limitation, neutrons, protons, photons, electrons, positrons, deuterons, tritons, helions, alpha particles, or other heavier charged particles, that create signals in a semiconductor. In addition, secondary particles include all generations of particles resulting from the interaction between secondary particles and detector materials. In one embodiment, the secondary particle radiator component may be fabricated from a hydrogen-containing material that can include, for example, a polymer that includes hydrogen atoms, such as polyethylene, high density polyethylene (HDPE), nylon, polyaramid, and the like. In certain embodiments, the secondary particle radiator component is formed in a substantially spherical shape.

After what is a substantially an elastic collision with the secondary particle radiator component, the neutron will most often deflect from its original path. The released or recoil secondary particle (e.g., a recoil proton) will be propelled relative to the original path of the neutron in a forward direction. In some embodiments, the secondary particle may pass through a filter or absorber layer (e.g., an aluminum or carbon layer for absorbing low energy secondary particles so as to increase the signal-to-noise ratio of the fast neutron spectrometer). The layered semiconductor detectors are preferably semiconductor detectors of the positive—intrinsic—negative (PIN) diode type having a PIN junction configuration containing an undoped intrinsic semiconductor region positioned between a p-type (i.e., excess of holes) semiconductor region and an n-type (i.e., excess of electrons) semiconductor region. When the secondary particle passes into the semiconductor, it ionizes the silicon, creating free electron hole (e-h) pairs. The total number of e-h pairs created is proportional to the energy deposited by the radiation in the semiconductor detector. The motion of the e-h pairs in the semiconductor produces an electrical signal which is indicative of neutron detection. Each subsequent semiconductor layer detects a smaller electrical signal, thereby facilitating reconstruction of the neutron kinetic energy spectrum. Because the neutron detector is substantially spherical, for a neutron of a given energy, the solid angle direction from which the neutron approaches the neutron detector has little or no impact on the neutron detector response.

Figure 2:
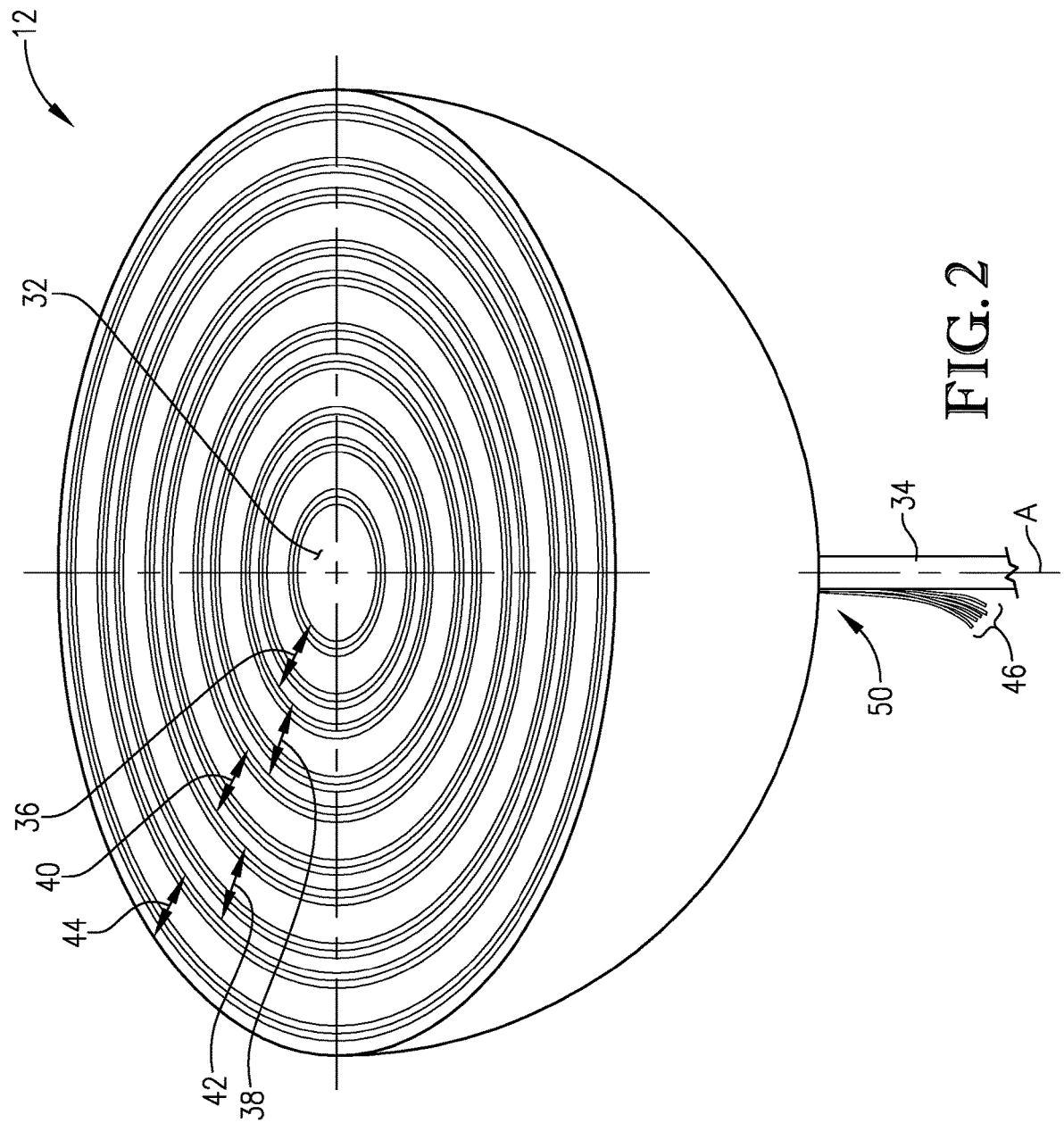
FIG. 2 is a schematic top perspective sectional view of an isotropic neutron detector of the neutron detection system of FIG. 1, taken along the line 2-2.
Figure 3:
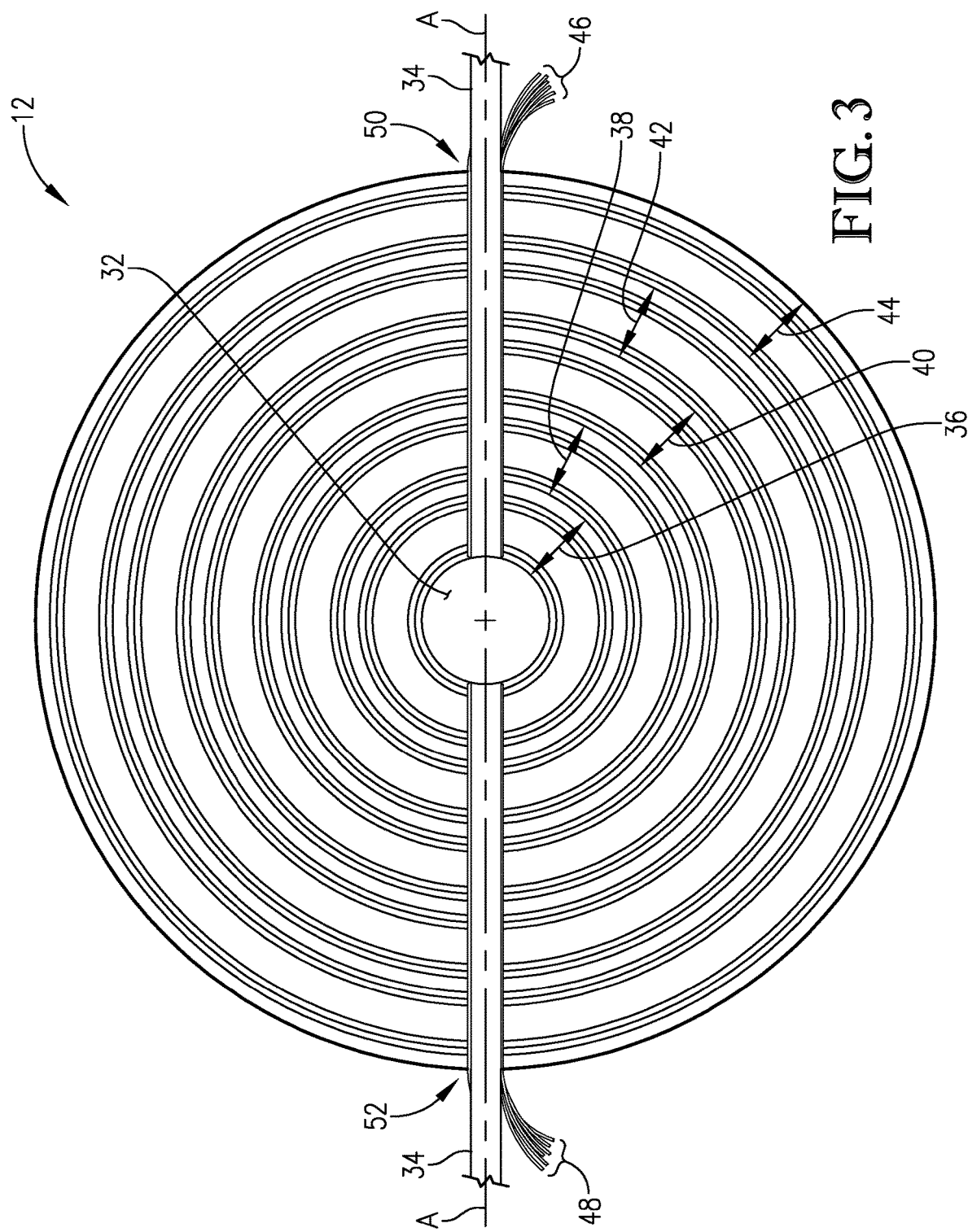
FIG. 3 is a schematic sectional view of the isotropic neutron detector of FIG. 1, taken along the line 3-3.

FIG. 1 is a schematic of a neutron detection system 10 for determining a neutron kinetic energy spectrum according to one embodiment of the present disclosure. FIG. 2 is a schematic top perspective sectional view of an isotropic neutron detector 12 of the neutron detection system 10 taken along the line 2-2 of FIG. 1. FIG. 3 is a schematic sectional view of the neutron detector 12 taken along the line 3-3 of FIG. 1. In certain embodiments, the present disclosure is directed to a low-power, high-efficiency isotropic semiconductor neutron detector that is small and portable (e.g., hand-held, shoulder carried, or the like). The neutron detection system 10 of the present disclosure is suitable for performing neutron kinetic energy spectroscopy and/or measuring quantities correlatable to neutron energy. As used herein, the isotropic neutron detector 12 may be interchangeably referred to as a neutron detector or a neutron spectrometer.

With reference to FIGS. 1-3, in the depicted embodiment, the neutron detection system 10 includes an isotropic neutron detector 12 and a controller 14 communicatively coupled to an output of the neutron detector 12. A neutron source 16 emits a plurality of neutrons 18, at least some of which pass through and/or into contact with the neutron detector 12. The neutron detector 12 is configured to determine one or more characteristics of the neutrons 18, for example, and without limitation, energy, energy spectrum, dose, flux, and the like.

The controller 14, for example, may be operated by a user 20. In the example embodiment, the controller 14 includes one or more processors 22 for executing instructions. In some embodiments, executable instructions are stored in a memory device 24. The processor 22 includes one or more processing units, for example, a multi-core configuration. The memory device 24 is any device allowing information such as executable program instructions and/or written works to be stored and retrieved, which may be configured to cause the one or more processor 22 to carry out one or more of the various steps (e.g., system control steps, data analysis steps, and the like) described in the present disclosure. The memory device 24 includes one or more computer readable media.

In addition, the one or more processors 22 are configured to: receive one or more output signals from the neutron detector 12 and determine (e.g., determine in real-time, near real-time, or delayed time) the one or more characteristics of the neutron 18, for example, and without limitation, energy, energy spectrum, dose, flux, and the like.

The controller 14 also includes at least one output component 26 for presenting information to the user 20. The output component 26 is any component capable of conveying information to the user 20. In some embodiments, the output component 26 includes an output adapter such as a video adapter and/or an audio adapter. An output adapter is operatively coupled to the processor 22 and operatively connectable to an output device such as a display device, a liquid crystal display (LCD), organic light emitting diode (OLED) display, or "electronic ink" display, or an audio output device, a speaker, or headphones.

In some embodiments, the controller 14 includes an input device 28 for receiving input from the user 20. The input device 28 may include, for example, a touch sensitive panel, a touch pad, a touch screen, a stylus, a gyroscope, an accelerometer, a position detector, a keyboard, a pointing device, a mouse, or an audio input device. A single component such as a touch screen may function as both an output device of the output component 26 and the input device 28. The controller 14 may also include a communication interface 30, which is communicatively connectable to a remote device such as the neutron detector 12. The communication interface 30 may include, for example, a wired or wireless network adapter or a wireless data transceiver for use with Bluetooth communication, radio frequency communication, near field communication (NFC), and/or with a mobile phone network, Global System for Mobile communications (GSM), 3G, or other mobile data network, and/or Worldwide Interoperability for Microwave Access (WiMax) and the like.

Stored in the memory device 24 are, for example, computer readable instructions for providing a user interface to the user 20 via the output component 26 and, optionally, receiving and processing input from the input device 28. A user interface may include, among other possibilities, a web browser and a client application. Web browsers enable users, such as the user 20, to display and interact with media and other information typically embedded on a web page or a website. A client application allows the user 20 to interact with an application for control of the neutron detector 12.

As best illustrated in FIGS. 2 and 3, the isotropic neutron detector 12 includes a spherical core or secondary particle radiator component 32 positioned at the center of the spherical-shaped neutron detector 12. In the exemplary embodiment, the secondary particle radiator component 32 has a diameter in the range between and including 0.9 centimeters (cm) and 1.1 cm, with a preferable diameter of 1.0 cm±a manufacturing tolerance of 0.005 cm. Alternatively, the secondary particle radiator component 32 may have any diameter that enables the neutron detector 12 to function as described herein, and may be hollow, with some optimized spherical shell thickness. In the exemplary embodiment, the secondary particle radiator component 32 is fabricated from a hydrogen-containing material that includes, for example, and without limitation, a polymer that includes hydrogen atoms, such as polyethylene, high density polyethylene (HDPE), nylon, polyaramid, and the like.

To facilitate securing the secondary particle radiator component 32, one or more support members 34 (e.g., support rods) are coupled to an exterior surface of the secondary particle radiator component 32. In the exemplary embodiment, the neutron detector 12 includes two support members 34 extending outward from the secondary particle radiator component 32. The two support members 34 are cylindrical in shape and colinear, defining a longitudinal axis "A" that extends substantially through a center point of the secondary particle radiator component 32 and defines a first pole 50 and a second pole 52 of the neutron detector 12. While the support members shown in FIGS. 1-3 are generally cylindrical, the support members 34 may be any shape that enables the neutron detector 12 to function as described herein, including, for example, rectangular, polygonal, and the like. The support members 34 are fabricated from, for example, a substantially neutron transparent material, including, for example, and without limitation, aluminum and alloys thereof, carbon fiber composite materials, stainless steel, zirconium, and the like. The substantially neutron transparent material of the support members 34 facilitates low neutron-induced background noise, facilitating increasing the signal-to-noise ratio of the neutron detector 12.

In the exemplary embodiment, the neutron detector 12 is an onion-like device that is fabricated with multiple layers of independently readable semiconductor detectors 36, 38, 40, 42, and 44. While the neutron detector 12 is illustrated having five (5) semiconductor detector layers, it is contemplated that the neutron detector 12 can have a fewer or a greater number of semiconductor layers as determined by the particular application for the neutron detector 12. For example, in one suitable embodiment, the neutron detector 12 includes twenty (20) semiconductor detector layers.

The $1^{st}$ layer semiconductor detector 36 surrounds a substantial portion of the spherical-shaped secondary particle radiator component 32, other than at the connection between the secondary particle radiator component 32 and the support members 34, i.e., the first pole 50 and a second pole 52. Accordingly, the $1^{st}$ layer semiconductor detector 36 forms a concentric shell around the spherical-shaped secondary particle radiator component 32. The $1^{st}$ layer semiconductor detector 36 may be coupled to the secondary particle radiator component 32 using any method that enables the neutron detector 12 to function as described herein, such as, without limitation, an adhesive bonding process. In addition, the $1^{st}$ layer semiconductor detector 36 includes, for example, one or more bonding wires 46 and 48 coupled thereto and extending along a respective support member 34. For example, in one embodiment, a first pole bonding wire 46 may be coupled to one side of the $1^{st}$ layer semiconductor detector 36 and extend outward along the support member 34, exiting at the first pole 50 of the neutron detector 12. A second pole bonding wire 48 may be coupled to an opposite side of the $1^{st}$ layer semiconductor detector 36 and extend outward along the other support member 34, exiting at the second pole 52 of the neutron detector 12. The bonding wires 46 and 48 may then be coupled in communication to the controller 14 (shown in FIG. 1).

The $2^{nd}$ layer semiconductor detector 38 substantially surrounds the $1^{st}$ layer semiconductor detector 36, other than at the first pole 50 and a second pole 52. Accordingly, the $2^{nd}$ layer semiconductor detector 38 forms a concentric shell around the $1^{st}$ layer semiconductor detector 36. The $2^{nd}$ layer semiconductor detector 38 may be coupled to the $1^{st}$ layer semiconductor detector 36 using, for example, and without limitation, an anodic wafer bonding process, a eutectic wafer bonding process, or any other bonding process that enables the neutron detector 12 to function as described herein. As described above with respect to the $1^{st}$ layer semiconductor detector 36, the $2^{nd}$ layer semiconductor detector 38 includes one or more of the bonding wires 46 and 48 coupled thereto and extending along a respective support member 34. The first pole bonding wire 46 may be coupled to one side of the $2^{nd}$ layer semiconductor detector 38 and extend outward along the support member 34, exiting at the first pole 50. The second pole bonding wire 48 may be coupled to an opposite side of the $2^{nd}$ layer semiconductor detector 38 and extend outward along the other support member 34, exiting at the second pole 52.

The $3^{rd}$ layer semiconductor detector 40, the $4^{th}$ layer semiconductor detector 42, and the $5^{th}$ layer semiconductor detector 44 are coupled to the neutron detector 12 in substantially the same way as described above with respect to the $2^{nd}$ layer semiconductor detector 38, with the $3^{rd}$ layer semiconductor detector 40 surrounding the $2^{nd}$ layer semiconductor detector 38, the $4^{th}$ layer semiconductor detector 42 surrounding the $3^{rd}$ layer semiconductor detector 40, and the $5^{th}$ layer semiconductor detector 44 surrounding the $4^{th}$ layer semiconductor detector 42. As such, each additional layer of semiconductor detectors forms a concentric shell around the overlaid semiconductor detector.

In the exemplary embodiment, the semiconductor detectors 36, 38, 40, 42, and 44 are sufficiently thin to enable the semiconductor detectors to bend around the secondary particle radiator component 32 and/or each other to form the spherical-shaped neutron detector 12. For example, in one embodiment, the semiconductor detectors 36, 38, 40, 42, and 44 are fabricated such that a thickness to radius of curvature ratio of each respective semiconductor detector is in the range between and including about 2.0% and about 0.1%. In the exemplary embodiment, the semiconductor detectors 36, 38, 40, 42, and 44 have a preferable ratio of about 0.8%. For example, where the secondary particle radiator component 32 has a preferable diameter of about 1 cm, the semiconductor detectors 36, 38, 40, 42, and 44 have a thickness of about 40 micrometers (μm). The thickness of each of the semiconductor detectors 36, 38, 40, 42, and 44 may be individually adjusted to facilitate detecting secondary particles of various energies as required by the anticipated use of the neutron detector 12. For example, the thicknesses may be increased in instances where the neutron detector may be used in higher energy radiation environments. In addition, the thicknesses of each layer may be varied to affect the resolution of the reconstruction of the neutron kinetic energy spectrum.

It is noted that each of the semiconductor layers of the neutron detector 12 may be fabricated from a single, continuous silicon wafer blank that may be wrapped, for example, around the spherical-shaped secondary particle radiator component 32 or a previous semiconductor layer. FIG. 4 is a schematic of an exemplary single, continuous spherical projection blank 60 that may be used to define a perimeter of one or more of the semiconductor detectors 36, 38, 40, 42, and 44. The perimeter of the blank 60 is similar to a symmetrically interrupted sinusoidal projection used in cartography. The horizontal line 62 defines a diameter of the approximated sphere of the blank 60. Each of the lobes 64 may be folded and joined at their seams to substantially approximate a sphere.

FIG. 5 is a schematic of an alternative single, continuous spherical projection blank 70 that may be used to define the perimeter of one or more of the semiconductor detectors 36, 38, 40, 42, and 44. The perimeter of the blank 70 is similar to an interrupted sinusoidal projection with asymmetrical lobes that is also used in cartography. As with the blank 60 described above, the horizontal line 72 defines a diameter of the approximated sphere of the blank 70. Each of the lobes 74 may be folded and joined at their seams to substantially approximate the sphere.

While each of the layer semiconductor detectors 36, 38, 40, 42, and 44 are described above as being formed from a single, continuous silicon wafer blank, it is also noted that each semiconductor layer of the neutron detector 12 may be formed by two or more semiconductor segments. That is, each semiconductor layer may be segmented (e.g., similar to the construction of a beach ball).

FIG. 6 is a schematic of an exemplary segment 80 that may be used to define a portion of a layer of the semiconductor detectors 36, 38, 40, 42, and 44. The segment 80 may be sized and shaped to enable two or more segments to substantially approximate a sphere. In a typical segmented spherical reconstruction, each segment is substantially the same size and shape and 3-10 segments 80 may be used to approximate the sphere. More preferably, 4-8 segments 80 may be used, with the most preferable spherical reconstruction using 6 segments 80. The horizontal line 82 defines a portion of the diameter of the approximated sphere. Each of the lobes 84 may be folded and joined at their seams to substantially approximate the sphere. Using segmented layer semiconductor detectors 36, 38, 40, 42, and 44 of the neutron detector 12 facilitates defining positional information around the spherical detector 12, which can assist in the quality of reconstruction of the neutron kinetic energy spectrum.

Figure 7:
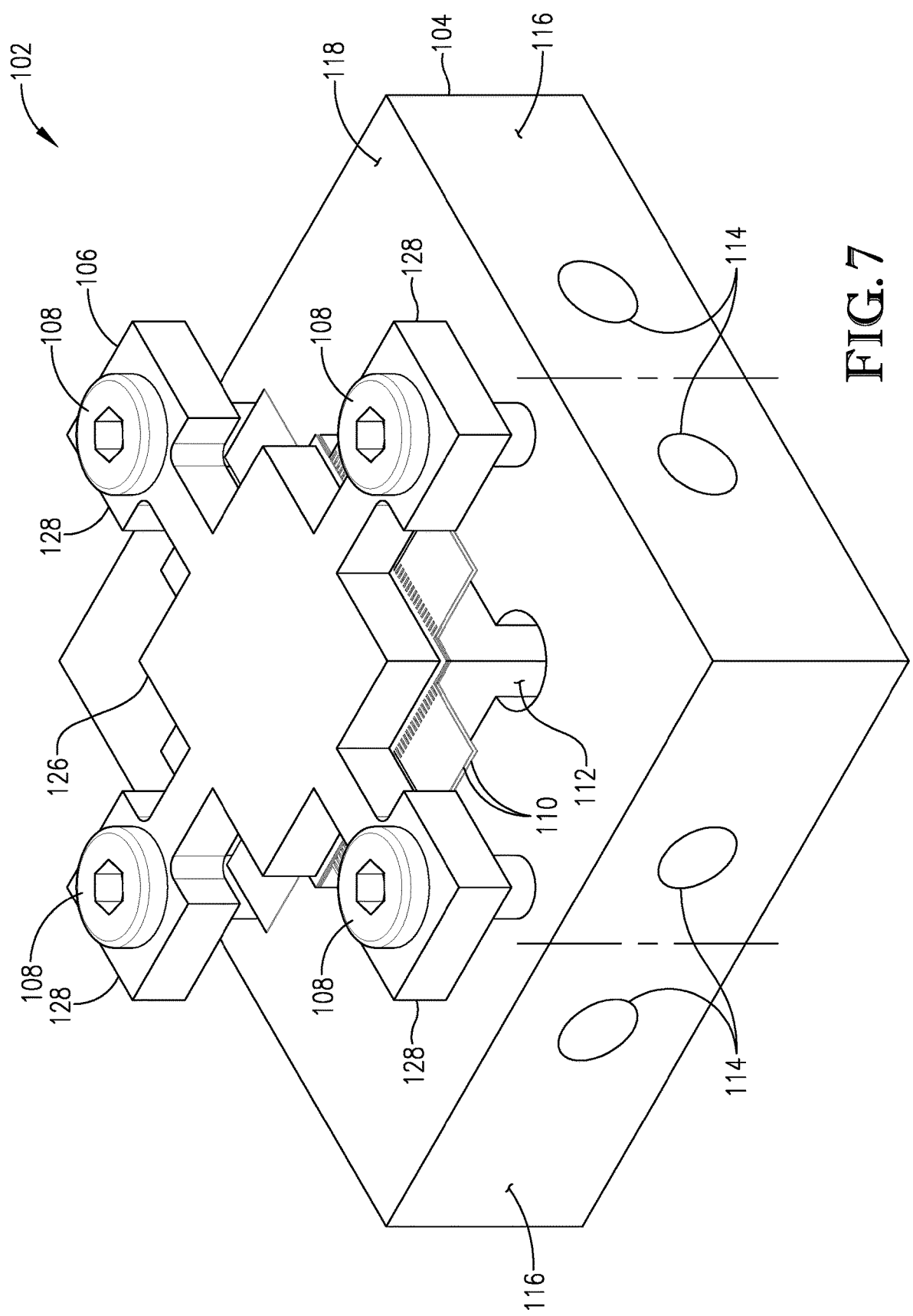
FIG. 7 is a schematic perspective of an anisotropic neutron detector that may be used with the neutron detection system shown in FIG. 1)
Figure 8:
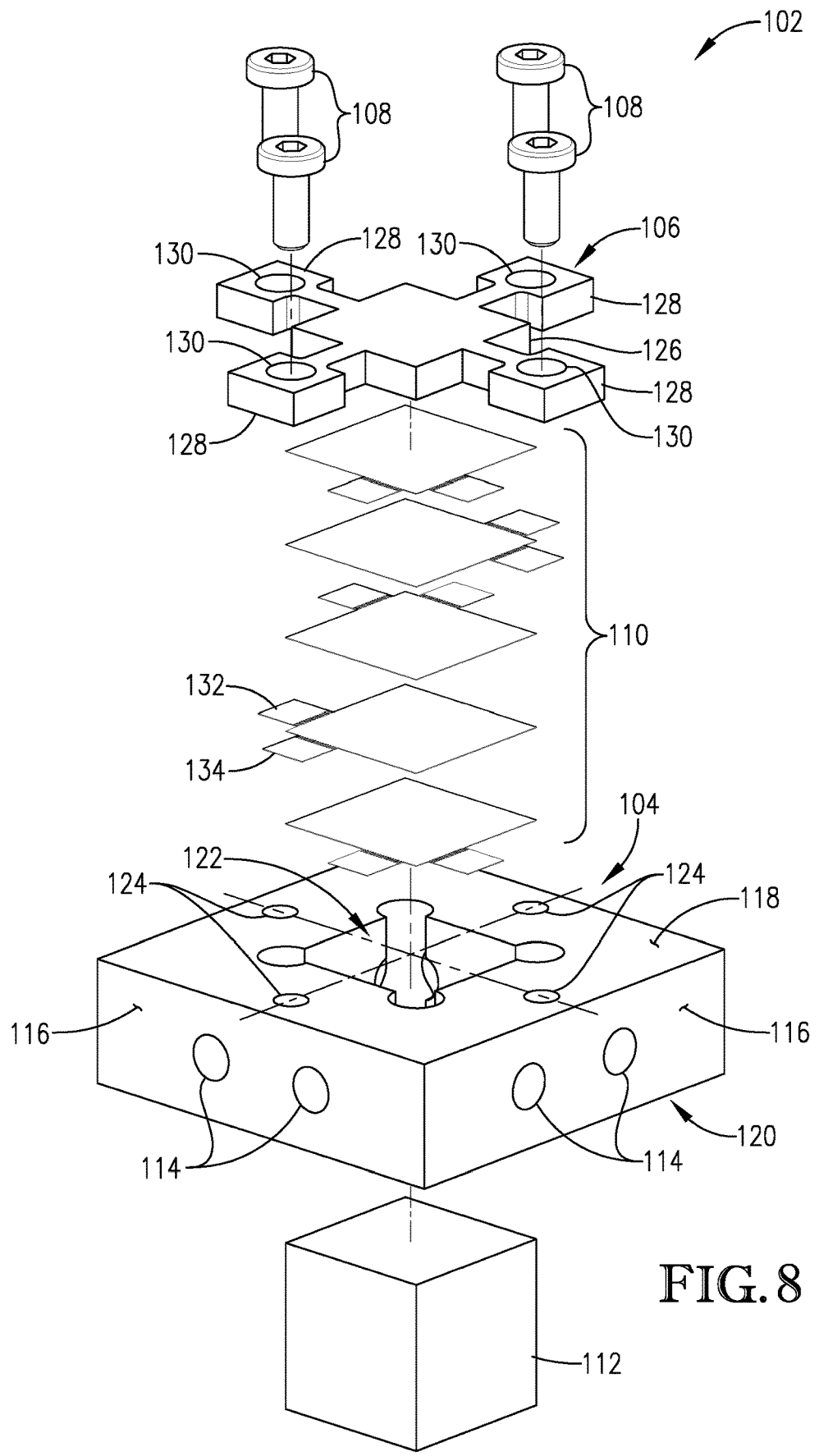
FIG. 8 is an exploded view of the neutron detector of FIG. 7.

FIG. 7 is a schematic perspective of an anisotropic neutron detector 102 that may be used with the controller 14 (shown in FIG. 1) to detect secondary particles for performing neutron kinetic energy spectroscopy and/or measuring quantities correlatable to neutron energy. FIG. 8 is an exploded view of the neutron detector 102. In the exemplary embodiment, the neutron detector 102 is configured to determine one or more characteristics of the neutron 18 (shown in FIG. 1), for example, and without limitation, energy, energy spectrum, dose, flux, and the like. The neutron detector 102 is a low-power, high-efficiency semiconductor neutron detector that is small and portable (e.g., hand-held, shoulder carried, or the like).

In the exemplary embodiment, the neutron detector 102 includes a support base 104, a clamp 106, a plurality of fasteners 108, a plurality of planar semiconductor detectors 110, and a secondary particle radiator component 112. The support base 104 is generally square in shape, although other shapes are contemplated, and includes a plurality of horizontal mounting holes 114 defined through each of the four sides 116 of the support base 104. Each side 116 of the support base 104 includes a pair of spaced mounting holes 114 generally centered on the side 116, although any location or spacing may be used. In one embodiment, the pair of spaced mounting holes 114 are about 0.3 inches (in.) apart and are centered between an upper surface 118 and lower surface 120 of the mounting base 104 and along the side 116. The mounting holes 114 may be threaded and are configured to receive a fastener for securely mounting, for example, the secondary particle radiator component 112 and/or the neutron detector 102.

As best illustrated in FIG. 8, the support base 104 includes a central opening 122 defined therethrough, between the upper and lower surfaces 118 and 120. The central opening 122 is substantially square, having arcuate relief notches defined at each corner thereof. The central opening is configured to receive the secondary particle radiator component 112 therein, as shown in FIG. 7. It is noted that the central opening 122 may have any shape that enables the neutron detector 102 to function as described herein. In addition, the support base 104 includes a plurality of clamp mounting holes 124 defined therethrough. The clamp mounting holes 124 are configured to receive the plurality of fasteners 108, as shown in FIG. 7, for securing the clamp 106 to the support base 104.

The clamp 106 includes a central portion 126 that is sized and shaped to generally conform to a perimeter of the secondary particle radiator component 112 received in the central opening 122 of the support base 104. This facilitates securing each of the planar semiconductor detectors 110 thereto. Extending outward from the central portion 126 are a plurality of arms 128, each arm corresponding to a respective clamp mounting hole 124 of the support base 104. Each arm 128 includes a fastener receiving hole 130 positioned at a distal end of the arm, wherein the fastener receiving hole 130 is substantially concentric to a respective clamp mounting hole 124. A respective fastener 108 is passed through a fastener receiving hole 130 and coupled to a respective clamp mounting hole 124 to secure the clamp 106 to the support base 104.

Each of the support base 104 and the clamp 106 is fabricated from, for example, a substantially neutron transparent material, including, for example, and without limitation, aluminum and alloys thereof, carbon fiber composite materials, stainless steel, zirconium, and the like. The substantially neutron transparent material of the support base 104 and the clamp 106 facilitates low neutron-induced background noise, facilitating increasing the signal-to-noise ratio of the neutron detector 102.

The secondary particle radiator component 112 is cuboid in shape and is sized to be received within the central opening 122 of the support base. As described above with respect to the secondary particle radiator component 32, the secondary particle radiator component 112 is fabricated from a hydrogen-containing material that includes, for example, and without limitation, a polymer that includes hydrogen atoms, such as polyethylene, high density polyethylene (HDPE), nylon, polyaramid, and the like. The secondary particle radiator component 112 may be secured to the support base 104 via one or more fasteners extending through one or more of the mounting holes 114.

In the exemplary embodiment, the neutron detector includes five (5) of the planar semiconductor detectors 110, arranged in a stacked relationship between the secondary particle radiator component 112 and the clamp 106. A first planar semiconductor detector 110 is positioned at a surface of the secondary particle radiator component 112, with each addition planar semiconductor detector 110 positioned against a previously stacked planar semiconductor detector 110. While the neutron detector 102 is illustrated having five (5) semiconductor detectors 110, it is contemplated that the neutron detector 102 can have a fewer or a greater number of semiconductor detectors 110 as determined by the anticipated use of the neutron detector 102. For example, in one suitable embodiment, the neutron detector 102 includes twenty (20) semiconductor detectors 110. As described herein, the stacked arrangement of the semiconductor detectors 110 facilitate reconstruction of a neutron kinetic energy spectrum.

The semiconductor detectors 110 are substantially identical to each other and are sized and shaped to conform to a perimeter of the secondary particle radiator component 112. Accordingly, in the exemplary embodiment, the semiconductor detectors 110 are square in shape. It is contemplated that the semiconductor detectors 110 can any size and shape that enables the neutron detector 102 to function as described herein. In the exemplary embodiment, the semiconductor detectors 110 include a first readout tab 132 and a second readout tab 134. The readout tabs 132 and 134 correspond respectively to an upper and lower metallization layer (not shown in FIGS. 7 and 8) of the semiconductor detector 110, as is described herein. In use, one or more bonding wires are coupled thereto and may then be coupled in communication to the controller 14 (shown in FIG. 1).

Figure 9:
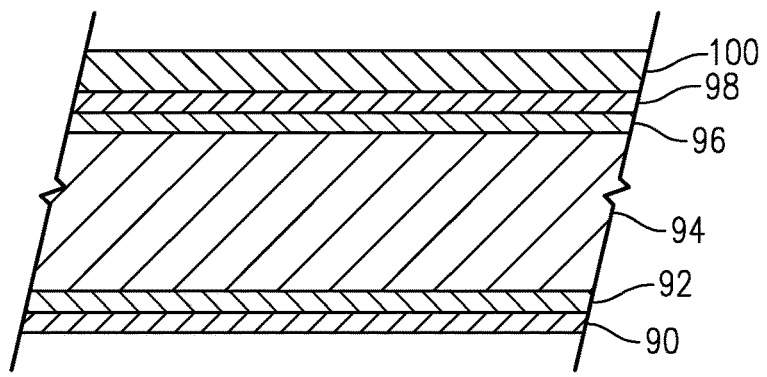
FIG. 9 is a sectional view of a semiconductor detector, such as the semiconductor detectors shown in FIGS. 2 and 7.

FIG. 9 is a sectional view of the semiconductor detectors 36, 38, 40, 42, 44, and 110, according to one embodiment of the disclosure. Although in FIG. 9 each semiconductor layer is shown as having a flat shape, the semiconductor layers for the semiconductor detectors 36, 38, 40, 42, and 44 may be arcuate, i.e., laid one on another outward as shown in FIGS. 2 and 3 in the radial direction so as to form a spherical surface. In the neutron detectors 12 and 102, it is preferable that the semiconductor detectors, such as the semiconductor detectors 36, 38, 40, 42, and 44 (shown in FIGS. 2 and 3, and the semiconductor detectors 110 (shown in FIG. 8), are of the PIN diode type having a PIN junction configuration consisting of an undoped intrinsic semiconductor region positioned between a p-type semiconductor region and an n-type semiconductor region sandwiched between to metallization layers.

With reference to FIG. 9, the semiconductor detectors 36, 38, 40, 42, 44, and 110 may be fabricated from a silicon on insulator (SOI) wafer. The SOI wafer is a three-layer material stack having an active layer of nearly intrinsically pure silicon 94 (the device layer, also referred to as the intrinsic layer) over a buried oxide layer (the box, not shown) of electrically insulating silicon dioxide, over a bulk silicon support wafer (the handle, not shown). In the exemplary embodiment, as described above, the intrinsic layer 94 may be about 40 μm thick. An n-type layer 96 is formed or diffused into a first surface of the intrinsic layer 94. In the example embodiment, the n-type layer 96 is formed using phosphorous as the dopant, although any material that enables the semiconductor detectors to function as described herein may be used. An oxide layer (not shown) may then be formed over the n-type layer 96 and the backside of the handle to protect the layers during an etching process described herein.

The oxide layer formed on the handle, the handle itself, and the box may then be etched to expose a second surface or backside of the intrinsic layer 94 (side opposite the n-type layer 96). The etching process may include, without limitation, any etching process suitable for semiconductor manufacturing, including hydrofluoric acid (HF) etching, potassium hydroxide (KOH) etching, tetramethylammonium hydroxide (TMAH) etching and the like.

A p-type layer 92 is formed or diffused into the second surface of the intrinsic layer 94. In the example embodiment, the p-type layer 92 is formed using boron as the dopant, although any material that enables the semiconductor detectors to function as described herein may be used. The intrinsic layer 94 (including the p-type layer 92 and the n-type layer 96 formed therein) is patterned and etched to define the size and shape (i.e., the pattern) of the semiconductor detectors 36, 38, 40, 42, 44, and 110. As described above, the etching process may include, without limitation, any etching process suitable for semiconductor manufacturing, including hydrofluoric acid (HF) etching, potassium hydroxide (KOH) etching, tetramethylammonium hydroxide (TMAH) etching and the like. The etching pattern for defining the pattern of the semiconductor detectors is configured to leave a plurality of tethers (not shown) behind to hold the intrinsic layer 94 in place with the SOI wafer to complete the fabrication process as described herein. The tethers are sufficiently small in size to be easily fractured to removes the completed semiconductor detectors 36, 38, 40, 42, 44, and 110. The patterning and etching step is followed by etching the silicon dioxide layers to release the device layer or intrinsic layer 94.

A first metal layer 90, or first electrode, is formed on the p-type layer 92 and a second metal layer 98, or second electrode, is formed on the n-type layer 96. The first and second metal layers may be formed using one or more of a chemical vapor deposition process, a sputtering process, or a combination thereof. Alternatively, any process for forming a metal layer on a silicon semiconductor may be used that enables the semiconductor to function as described herein. It is contemplated that any metal or metal stack that enables the semiconductor to function as described herein may be used.

An insulating layer 100 is then formed on one or more of the electrodes or metal layers 90 and 98 to provide electrical isolation to the metal layer, for example, when the semiconductor detectors 36, 38, 40, 42, 44, and 110 are stacked on top of one another. The insulating layer 100 may be formed using a sputtering process, although other application processes are contemplated. The insulating layer 100 may substantially cover the respective metal layer, leaving only a portion uncovered, such as the readout tabs 132 and 134 of the semiconductor detector 110 (shown in FIG. 8), for soldering one or more one or more bonding wires thereto. After the insulating layer 100 is formed, the semiconductor detector, such as the semiconductor detectors 36, 38, 40, 42, 44, and 110, may be removed from the SOI wafer, for example, by breaking the tethers described herein.

Figure 10:
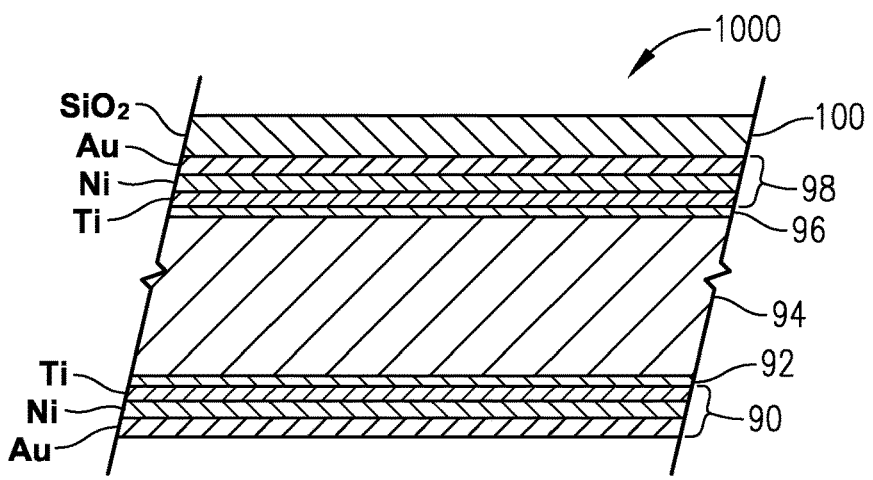
FIG. 10 is a sectional view of one suitable embodiment of a semiconductor detector, according to one embodiment of the disclosure.

FIG. 10 is a sectional view of one suitable embodiment of a semiconductor detector 1000, according to one embodiment of the disclosure. The semiconductor detector 1000 is substantially similar to the semiconductor detectors 36, 38, 40, 42, 44, and 110, and includes the intrinsic layer 94 having the p-type layer 92 and n-type layer 96 formed thereon. The semiconductor detector 1000 also includes the first metal layer 90 and the second metal layer 98, opposite the first metal layer 90. In addition, the semiconductor detector 1000 includes the insulating layer 100. In the illustrated embodiment, the metal layers 90 and 98 are formed from a metal layer stack that includes, in serial arrangement, a titanium (Ti) layer, a nickel (Ni) layer, and a gold (Au) layer. In addition, the insulating layer 100 is formed from silicon-dioxide ($SiO_2$).

Figure 11:
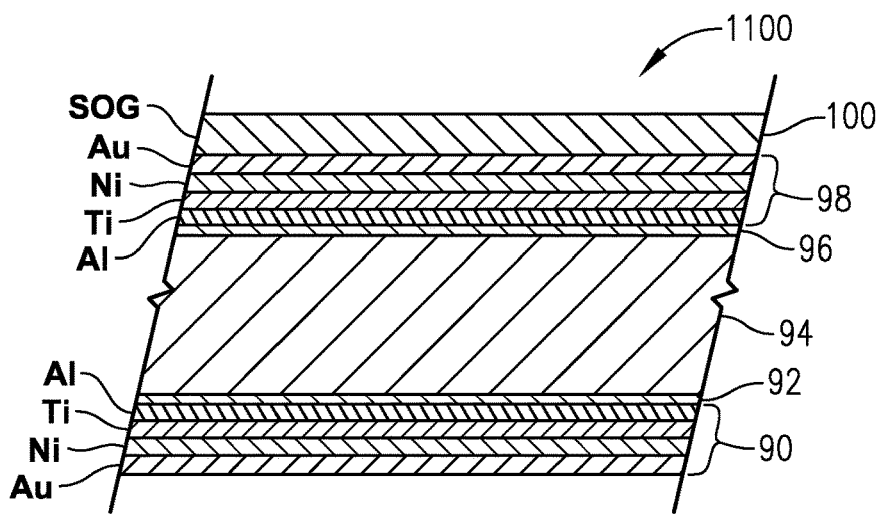
FIG. 11 is a sectional view of one suitable embodiment of a semiconductor detector, according to another embodiment of the disclosure.

FIG. 11 is a sectional view of one suitable embodiment of a semiconductor detector 1100, according to another embodiment of the disclosure. The semiconductor detector 1100 is substantially similar to the semiconductor detectors 36, 38, 40, 42, 44, and 110, and includes the intrinsic layer 94 having the p-type layer 92 and n-type layer 96 formed thereon. The semiconductor detector 1100 also includes the first metal layer 90 and the second metal layer 98, opposite the first metal layer 90. In addition, the semiconductor detector 1100 includes the insulating layer 100. In the illustrated embodiment, the metal layers 90 and 98 are formed from a metal layer stack that includes, in serial arrangement, an aluminum (Al) layer, a titanium (Ti) layer, a nickel (Ni) layer, and a gold (Au) layer. In addition, the insulating layer 100 is formed as a spin-on glass (SOG) layer, which may be a doped or an undoped SOG material. The SOG layer is spun onto one of the metal layers 90 or 98 (i.e., a device layer) of the semiconductor detector 1100 to function as a dielectric when multiple semiconductor detectors 1100 are stacked.

Figure 12:
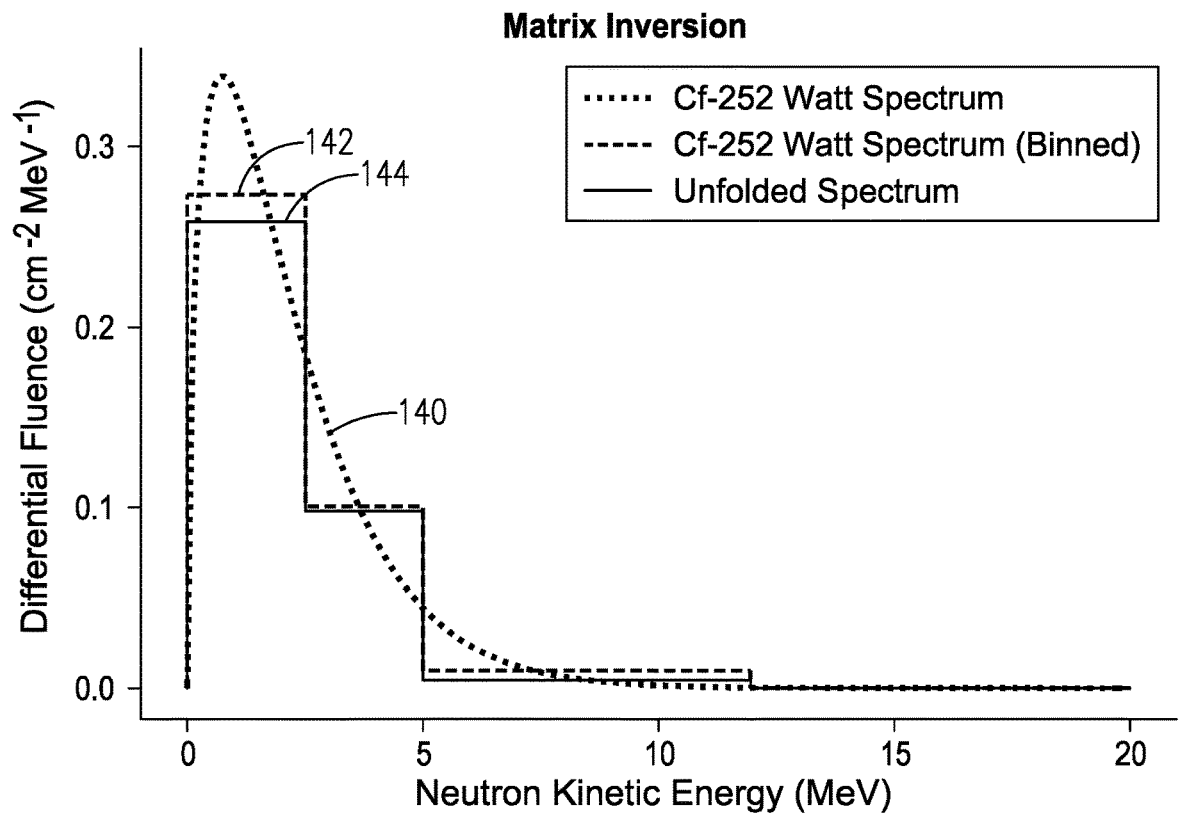
FIG. 12 is a plot illustrating neutron spectrum reconstruction for a $^{252}$Cf Watt spectrum for a five (5) semiconductor detector layer neutron detector with mono-directional neutron incidence.
Figure 13:
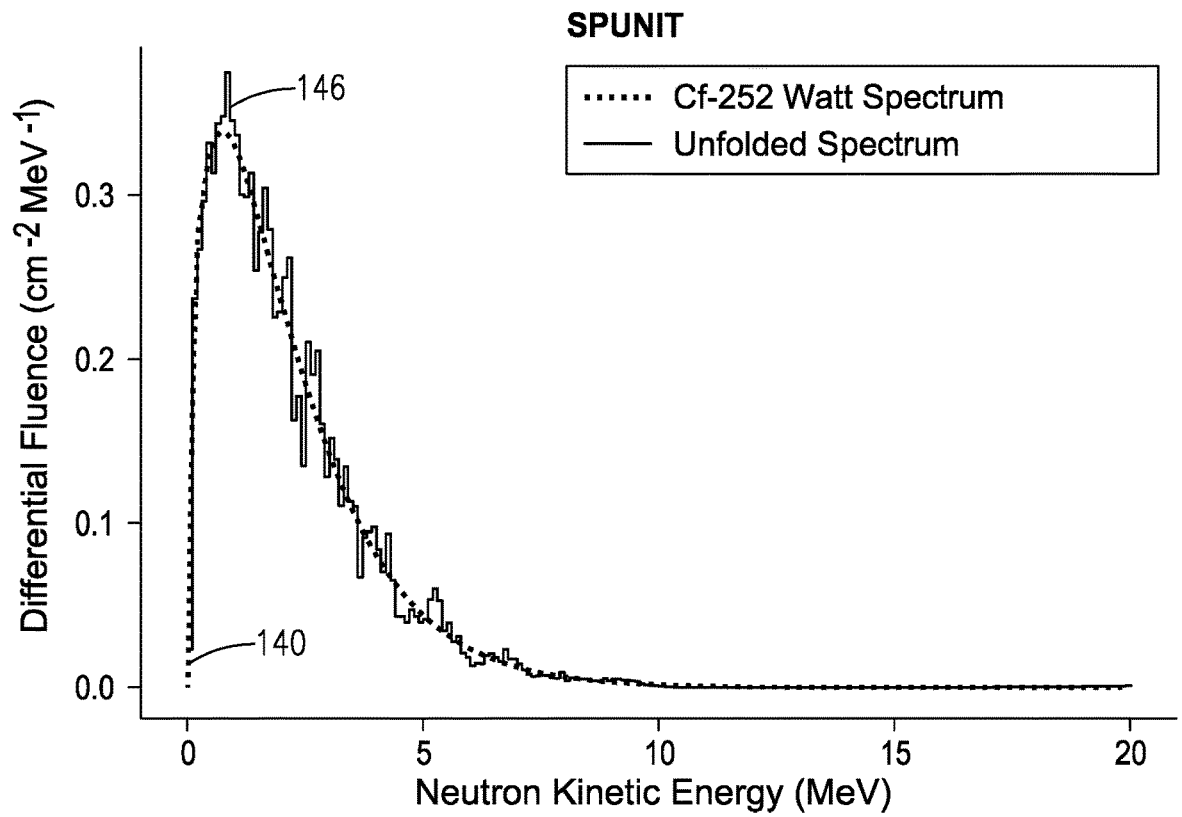
FIG. 13 is a plot illustrating neutron spectrum reconstruction for a $^{252}$Cf Watt spectrum for a twenty (20) semiconductor detector layer neutron detector with mono-directional neutron incidence.

FIG. 12 is a plot illustrating a simulated neutron spectrum reconstruction for a $^{252}$Cf Watt spectrum for the five (5) semiconductor detector neutron detector 102 with mono-directional neutron incidence. FIG. 13 is a plot illustrating a simulated neutron spectrum reconstruction for a $^{252}$Cf Watt spectrum for a twenty (20) semiconductor detector neutron detector 102 with mono-directional neutron incidence. The x-axes indicate a neutron kinetic energy measure in mega-electron volts (MeV) and the y-axes are a measure of differential fluence in neutrons per centimeter squared (cm$^2$) per MeV. A $^{252}$Cf Watt spectrum is routinely used to represent the fluence energy distribution for neutrons born from fission and was used here to test the ability of the neutron detector 102 to unfold an incident neutron energy spectrum. In FIGS. 12 and 13, the dotted lines 140 show a continuous actual $^{252}$Cf Watt spectrum, separated into two hundred (200) energy bins of 0.1 MeV (represented by each dot of the dotted line 140).

Neutron spectrum unfolding relates to the determination of an energy spectrum of incident neutrons from a plurality of detector outputs. Unfolding of the neutron spectrum may be performed using a range of algorithms. Two (2) methods were used to unfold the incident neutron spectrum based on a Particle and Heavy Ion Transport code System (PHITS) simulation of the tally of energy deposition in the active regions of the semiconductor detectors of the neutron detector 102. The simulations were performed using the neutron detector 102 having five (5) semiconductor layers and twenty (20) semiconductor layers. The two (2) unfolding methods used include the Matrix Inversion Unfolding Method and the SPUNIT unfolding algorithm.

Referring back to FIG. 12, the dashed line 142 shows the average neutron fluence for each of the energy bins found from the continuous actual $^{252}$Cf Watt spectrum, and the solid line 144 shows the unfolded (i.e., reconstructed) spectrum from the matrix inversion approach. The plot illustrates that the neutron detector 102 with the five (5) semiconductor detectors 110 can sufficiently perform neutron energy spectrum reconstruction, as indicated by the solid line 144.

Referring back to FIG. 13, the solid line 146 shows the unfolded (i.e., reconstructed) spectrum using the SPUNIT unfolding algorithm approach. The plot illustrates that the neutron detector 102 with the twenty (20) semiconductor detectors 110 can sufficiently perform neutron energy spectrum reconstruction, as indicated by the solid line 146, using the SPUNIT unfolding algorithm.

As described herein, with reference to FIG. 1, the isotropic neutron detector 12 relies on the direct detection of charged particles (secondary particles) resulting from neutron interactions. In particular, a small mass of polyethylene, such as the secondary particle radiator component 32, is used to generate secondary particles (e.g., recoil protons) from interactions (e.g., elastic collisions) with a field of incident neutrons, such as the neutrons 18, with hydrogen nuclei. The secondary particles may then interact with and/or penetrate one or more of the semiconductor detectors 36, 38, 40, 42, and 44 in the spherical neutron detector 12. The spherical form of the neutron detector 12 facilitates generally isotropic neutron incidence with respect to the one or more of the semiconductor detectors 36, 38, 40, 42, and 44. Since secondary particles are charged particles and will lose some energy to each semiconductor detectors, electrical output signals may be detected or read at each encountered semiconductor detector layer. Direct interactions of the neutrons with the semiconductor detector material may also contribute to the signals. Lower energy secondary particles may only be detected by a limited number of the first layers of semiconductor detectors, i.e., semiconductor detectors 36 and 38 for example. Thus, by using the controller 14 to detect the electrical output charge signals (indicative of detected secondary particles) from the semiconductor detectors and compare the signals from each of the semiconductor detectors, the controller 14 can reconstruct the incident neutron energy spectrum.

Radiation monitoring is crucial for characterizing, limiting, and ultimately reducing cancer risk from ionizing radiation (IR). Neutron measurements are particularly challenging since the uncharged particle must be converted to a charged particle which deposits energy in a detector. Furthermore, knowledge of the neutron kinetic energy spectrum is needed to apply energy-dependent radiation weighting factors and calculate organ doses, which are then converted to organ-specific cancer risks. State-of-the-art methods for detecting neutrons are massive and can involve challenging signal processing techniques that introduce unacceptable errors. The miniaturized fast neutron detectors described herein solve at these problems, as is described above.

Any actions, functions, operations, and the like recited herein may be performed in the order described above and/or shown in the figures or may be performed in a different order. Furthermore, some operations may be performed concurrently as opposed to sequentially. Although the methods are described above, for the purpose of illustration, as being executed by an example system and/or example physical element, it will be understood that the performance of any one or more of such actions may be differently distributed without departing from the spirit of the present disclosure.

A computer-readable storage media or medium comprising a non-transitory medium may include an executable computer program stored thereon and for instructing one or more processing elements to perform some or all of the operations described herein, including some or all of the operations of the computer-implemented method. The computer program stored on the computer-readable medium may instruct the processor and/or other components of the system to perform additional, fewer, or alternative operations, including those discussed elsewhere herein.

The terms "processor," "processing element," and the like, as used herein, may, unless otherwise stated, broadly refer to any programmable system including systems using central processing units, microprocessors, microcontrollers, reduced instruction set circuits (RISC), application specific integrated circuits (ASIC), logic circuits, and any other circuit or processor capable of executing the functions described herein. The above examples are example only and are thus not intended to limit in any way the definition and/or meaning of the term "processor." In particular, a "processor" may include one or more processors individually or collectively performing the described operations. In addition, the terms "software," "computer program," and the like, may, unless otherwise stated, broadly refer to any executable code stored in memory for execution on mobile devices, clusters, personal computers, workstations, clients, servers, and a processor or wherein the memory includes read-only memory (ROM), electronic programmable read-only memory (EPROM), random access memory (RAM), erasable electronic programmable read-only memory (EEPROM), and non-volatile RAM (NVRAM) memory. The above memory types are example only and are thus not limiting as to the types of memory usable for storage of a computer program.

The terms "controller," "computing device," "computer system," and the like, as used herein, may, unless otherwise stated, broadly refer to substantially any suitable technology for processing information, including executing software, and may not be limited to integrated circuits referred to in the art as a computer, but may broadly refer to a microcontroller, a microcomputer, a programmable logic controller (PLC), an application specific integrated circuit, and other programmable circuits, and these terms are used interchangeably herein.

The term "network," "communications network," and the like, as used herein, may, unless otherwise stated, broadly refer to substantially any suitable technology for facilitating communications (e.g., GSM, CDMA, TDMA, WCDMA, LTE, EDGE, OFDM, GPRS, EV-DO, UWB, Wi-Fi, IEEE 802 including Ethernet, WiMAX, and/or others), including supporting various local area networks (LANs), personal area networks (PAN), or short-range communications protocols.

The term "communication component," "communication interface," and the like, as used herein, may, unless otherwise stated, broadly refer to substantially any suitable technology for facilitating communications, and may include one or more transceivers (e.g., WWAN, WLAN, and/or WPAN transceivers) functioning in accordance with IEEE standards, 3GPP standards, or other standards, and configured to receive and transmit signals via a communications network.

The term "memory area," "storage device," and the like, as used herein, may, unless otherwise stated, broadly refer to substantially any suitable technology for storing information, and may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

Although the disclosure has been presented with reference to the one or more embodiments illustrated in the figures, it is understood that equivalents may be employed, and substitutions made herein without departing from the scope of the disclosure as recited in the claims.

Having thus described one or more embodiments of the disclosure, what is claimed as new and desired to be protected by Letters Patent includes the following:

What is claimed is:

1. A neutron detector comprising:
   a support base comprising a central opening defined therethrough;
   a secondary particle radiator component coupled to said support base and positioned at least partially within said central opening, said secondary particle radiator component configured to receive incident neutrons and generate secondary particles;
   a first semiconductor detector secured at a surface of said secondary particle radiator component and configured to detect the generation of said secondary particles from the secondary particle radiator component;
   a second semiconductor detector secured against said first semiconductor detector opposite said secondary particle radiator component and configured to detect said secondary particles passing through said first semiconductor detector; and
   a clamp coupled to said support base, said clamp positioned against said second semiconductor detector for securing each of said first and second semiconductor detectors against said secondary particle radiator component.

2. The neutron detector in accordance with claim 1, wherein said support base comprises a plurality of clamp mounting holes defined through a top surface of said support base, said plurality of clamp mounting holes receiving a respective fastener for securing said clamp to said support base.

3. The neutron detector in accordance with claim 2, wherein said clamp comprises:
   a central portion that conforms to a perimeter of said secondary particle radiator component; and
   a plurality of arms, each respective arm corresponding to a respective clamp mounting hole.

4. The neutron detector in accordance with claim 3, wherein each said respective arm comprises a fastener receiving hole formed concentric with a respective clamp mounting hole, each said fastener receiving hole receiving a fastener therethrough for securing said clamp to said support base.

5. A neutron detector comprising:
   a support base comprising a central opening defined therethrough;
   a secondary particle radiator component coupled to said support base and positioned at least partially within said central opening, said secondary particle radiator component configured to receive incident neutrons and generate secondary particles;
   a first semiconductor detector secured at a surface of said secondary particle radiator component and configured to detect the generation of said secondary particles from the secondary particle radiator component;
   a second semiconductor detector secured against said first semiconductor detector opposite said secondary particle radiator component and configured to detect said secondary particles passing through said first semiconductor detector,
   wherein said support base comprises a plurality of mounting holes defined through a side of said support base, at least one mounting holes of said plurality of mounting holes extending through to said central opening.

* * * * *